United States Patent
Yamashita

(10) Patent No.: US 6,843,675 B2
(45) Date of Patent: Jan. 18, 2005

(54) STANDING BOARD FIXING STRUCTURE

(75) Inventor: Hiroshi Yamashita, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 13 days.

(21) Appl. No.: 10/463,040

(22) Filed: Jun. 17, 2003

(65) Prior Publication Data

US 2003/0236006 A1 Dec. 25, 2003

(30) Foreign Application Priority Data

Jun. 19, 2002 (JP) .................................. 2002-003727 U

(51) Int. Cl.$^7$ ............................................. H01R 13/62
(52) U.S. Cl. ...................................... 439/329; 439/327
(58) Field of Search ................................. 439/329, 327, 439/371, 65

(56) References Cited

U.S. PATENT DOCUMENTS

| | | | | |
|---|---|---|---|---|
| 4,172,626 A | * | 10/1979 | Olsson ........................ | 439/329 |
| 5,603,628 A | * | 2/1997 | Schapiro, Jr. ............... | 439/327 |
| 5,980,296 A | * | 11/1999 | Mori et al. .................. | 439/329 |
| 6,007,357 A | * | 12/1999 | Perino et al. ............... | 439/327 |
| 6,482,019 B1 | * | 11/2002 | Lo Forte et al. ............ | 439/131 |

OTHER PUBLICATIONS

Japanese Unexamined Patent Publication No. 2000–196262; Jul. 14, 2000, 5 pgs.
Japanese Unexamined Utility Model Publication No. 5–18075, Mar. 5, 1993, 7 pgs.
Japanese Unexamined Utility Model Publication No. 6–41187, May 31, 1994, 7 pgs.

* cited by examiner

Primary Examiner—Gary Paumen
(74) Attorney, Agent, or Firm—Osha & May L.L.P.

(57) ABSTRACT

In a standing board fixing structure, a main board has a long hole, and a standing board has a hole inserting portion with taper faces of convergent shape formed at a bottom portion thereof. Engagement grooves are formed at an upper end portion of each taper face. A plated wire is attached onto the main board to stride across a region in the long hole corresponding to a lower edge portion on each taper face of the standing board. When the standing board is inserted into the long hole, the plated wire is guided to be gradually spread outwards along the taper faces and fitted and engaged in the engagement grooves, and the corresponding patterns of the standing board and the main board are soldered, whereby the standing board is stood and fixed on the main board.

5 Claims, 3 Drawing Sheets

STANDING BOARD FIXING STRUCTURE

BACKGROUND OF THE INVENTION

1. Field of the Invention

The present invention relates to a fixing structure for a standing board which is stood and fixed on a main board.

2. Description of the Related Art

A conventional standing board fixing structure is disclosed in, for example, JP-A-2000-196262.

In this fixing structure, as shown in FIGS. 4A, 4B and 4C, a standing board 102 is mounted and fixed on a heat sink 103 disposed near and roughly at right angles to the standing board 102, employing a securing pin 101 shaped like a U-character in plan view, and then mounted and fixed on a main board (not shown) in an almost vertically standing state. The securing pin 101 has one side 111 slightly shorter and slender than the other side 112. The heat sink 103 has large and small through holes 131 and 132 bored to insert the large and small sides 111 and 112 of the securing pin 101 into the corresponding regions on both side faces of the standing board 102. The standing board 102 has large and small fitting holes 121 and 122 for fitting the large and small pawls 111a and 112a provided at the top end of the large and small sides 111 and 112 of the securing pin 101.

However, this fixing structure has a need for the heat sink 103 and the securing pin 101 to fix the standing board 102 in the standing state. Thus, the number of parts is increased, the structure becomes complex, and the cost is increased.

A mounting structure for a metallic board is desclosed in JP-UM-A-5-18075.

As shown in FIGS. 5A, 5B and 5C, this mounting structure has mounting base means 220 continuously and integrally formed with at least a part 205 of a metallic board 201 having functional elements 203. The mounting base means 220 is used for mounting the metallic board 201 on a member to be mounted 260. The mounting base means 220 has conducting means 230 for the functional elements 230 that is provided in a part or a whole of this mounting base means 220.

However, in this mounting structure, a reinforcing leg 222 is provided by bending a bottom portion of the metallic board 201, whereby there is a problem in that the board must be a bendable metallic plate.

A board fixing device for an electronic apparatus is disclosed in JP-UM-A-6-41187.

As shown in FIGS. 6A and 6B, this board fixing device has a securing piece 311 in a metallic case 310 formed by stamping. A board 314 is disposed within the metallic case 311 and positioned at a top end potion 312 of the securing piece 311. An intermediate portion of the securing piece 311 is bent like a hook by punching from the side of the metallic case 310. The board 314 is soldered and fixed via the securing piece 311 to the metallic case 310.

However, there is a need for the metallic case 310 to fix the board 314.

SUMMARY OF THE INVENTION

This invention has been achieved to solve the above-mentioned problems associated with the prior art. It is an object of the invention to provide a fixing structure for a standing board stood and fixed on a main board, with a simple constitution, a smaller number of parts, and a lower cost, in which there is no need for modifying float or tumble of the standing board at the time of DIP, and an inclination of the standing board after being fixed.

In order to achieve the above object, a first aspect of the present invention provides a standing board fixing structure comprising: a main board having a long hole bored in a predetermined region thereof and a pattern; a standing board to be fixed on the main board in a standing state by inserting a bottom portion thereof into the long hole, the standing board having a pattern corresponding to the pattern of the main board, taper faces of convergent shape in the bottom portion on both side faces thereof and engagement grooves formed at an upper end portion of each taper face; and a plated wire attached onto a surface of the main board to stride across a region in the long hole of the main board corresponding to a lower edge portion on each taper face of the standing board, wherein when the standing board is inserted into the long hole of the main board, the plated wire is guided to be gradually spread outwards along the taper faces of the standing board and fitted and engaged in the engagement grooves, and the corresponding patterns of the standing board and the main board are soldered, whereby the standing board is stood and fixed on the main board.

A second aspect of the present invention provides a standing board fixing structure comprising: a main board having a long hole bored in a predetermined region thereof; a standing board to be fixed on the main board in a standing state by inserting a bottom portion thereof into the long hole, the standing board having engagement grooves formed on both side faces thereof; and a plated wire attached onto a surface of the main board to stride across a region in the long hole of the main board corresponding to a lower edge portion on each side face of the standing board, wherein when the standing board is inserted into the long hole of the main board, the plated wire is fitted and engaged in the engagement grooves of the standing board, whereby the standing board is stood and fixed on the main board.

According to a third aspect of the present invention, the corresponding patterns of the standing board stood on the main board and the main board are soldered whereby the standing board is stood and fixed on the main board.

According to a fourth aspect of the present invention, the plated wire is attached onto the main board to be spread to left and right toward a face where a pattern of the standing board is soldered to a pattern of the main board.

According to a fifth aspect of the present invention, a circular taper face of convergent shape converging toward the lower end is formed in a portion to be inserted into the long hole of the main board on both side faces of the standing board, wherein when the standing board is inserted into the long hole of the main board, the plated wire on the main board is guided to be spread outwards along the circular taper faces on both side faces of the standing board and fitted and fitted and engaged in the engagement grooves of the standing board.

BRIEF DESCRIPTION OF THE DRAWINGS

FIGS. 1A and 1B show a standing board fixing structure according to one embodiment of the present invention, in which FIG. 1A is a perspective view showing a state before the standing board is stood and fixed on a main board, and FIG. 1B is a perspective view showing a state in which the standing board is stood and fixed on the main board;

FIGS. 2A and 2B show a standing board fixing structure according to a second embodiment of the invention, in which FIG. 2A is a perspective view showing a state before the standing board is stood and fixed on the main board, and FIG. 2B is a perspective view showing a state in which the standing board is stood and fixed on the main board;

FIGS. 3A and 3B show a standing board fixing structure according to a third embodiment of the invention, in which FIG. 3A is a perspective view showing a state before the standing board is stood and fixed on the main board, and FIG. 3B is a perspective view showing a state in which the standing board is stood and fixed on the main board;

FIGS. 4A to 4C show a conventional standing board fixing structure, in which FIG. 4A is an exploded perspective view showing a prefixed state, FIG. 4B is a perspective view showing a fixed state, and FIG. 4C is a plan view showing the fixed state;

FIGS. 5A to 5C show a conventional fixing structure for a metal board, in which FIG. 5A is a perspective view, FIG. 5B is a side cross-sectional view, and FIG. 5C is a side cross-sectional view showing a state in which the metal board is mounted on a main board; and FIGS. 6A and 6B show a conventional fixing structure for an electronic apparatus board, in which FIG. 6A is a side view, and FIG. 6B is a cross-sectional view taken along the line A—A.

DETAILED DESCRIPTION OF THE PREFERRED EMBODIMENTS

Preferred embodiments of a standing board fixing structure according to the present invention will be described below with reference to the accompanying drawings.

Figure 1A:
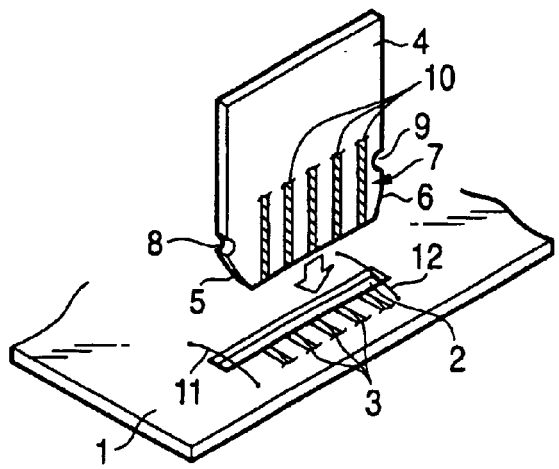
Figure 1B:
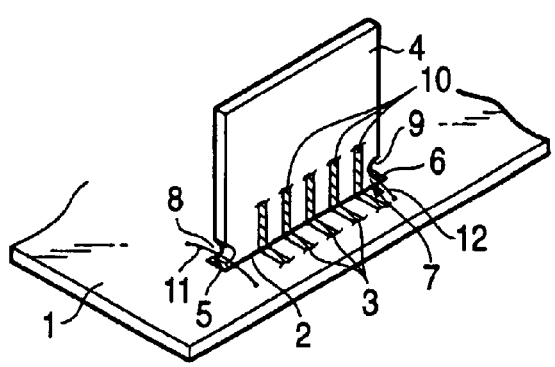

FIGS. 1A and 1B show a standing board fixing structure according to a first embodiment of the invention, in which FIG. 1A is a perspective view showing a state before a standing board is stood and fixed on a main board, and FIG. 1B is a perspective view showing a state in which the standing board is stood and fixed on the main board.

The standing board fixing structure has a long hole 2 bored in a predetermined region of the main board 1, with a plurality of stripes of patterns 3 formed on the surface of the main board 1 near a hole edge of the long hole 2 in the fore side in FIG. 1A.

The standing board 4 stood and fixed on the main board 1 by inserting it into the long hole 2 is formed with a hole inserting portion 7 having taper faces 5 and 6 of convergent shape in a bottom portion on both side faces thereof. Engagement grooves 8 and 9 are formed at the upper end portion of the taper faces 5 and 6. A plurality of stripes of patterns 10 are formed in a region of the bottom portion of the standing board 4 in the fore side in the figure corresponding to the pattern 3 of the main board 1.

Moreover, plated wires 11 and 12 are attached onto the surface of the main board 1 to stride across the regions in the long hole 2 of the main board 1 corresponding to the lower edge portions of the taper faces 5 and 6 of the standing board 4.

When the standing board 4 is inserted into the long hole 2 of the main board 1, the plated wires 11 and 12 are guided to be gradually spread outwards along the taper faces 5 and 6 of the standing board 3, and fitted and engaged in the engagement grooves 8, 9, and then the corresponding patterns 3 and 10 of the standing board 4 and the main board 1 are soldered, whereby the standing board 4 is stood and fixed on the main board 1.

Accordingly, the standing board fixing structure according to the first embodiment has a simple constitution, a smaller number of parts, and can be made at a lower cost, because the plated wires 11 and 12 are only employed, in addition to the standing board 4 and the main board 1. There is no need for modifying the standing board 4 stood on the main board 1 for a float or tumble at the time of DIP, and an inclination of the standing board 4 after being fixed. Moreover, since the corresponding patterns of the standing board 4 and the main board 4 are soldered, the standing board 4 is firmly fixed on the main board 1.

Figure 2A:
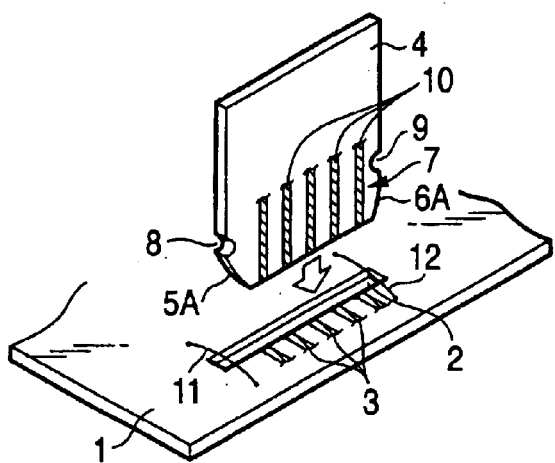
Figure 2B:
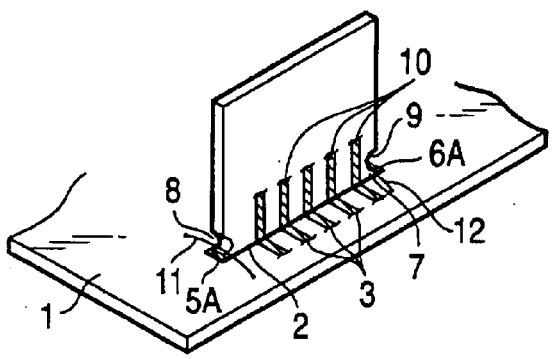

FIGS. 2A and 2B shows a standing board fixing structure according to a second embodiment of the invention, in which FIG. 2A is a perspective view showing a state before a standing board is stood and fixed on the main board, and FIG. 2B is a perspective view showing a state in which the standing board is stood and fixed on the main board. In this second embodiment, the same or like parts are designated by the same numerals as in the first embodiment, and the description of those parts is partly omitted.

The standing board fixing structure is formed with a circular taper faces 5A and 6A of convergent shape converging toward the lower end on both side faces of the standing board 4 to be inserted into the long hole 2 of the main board 1. When the standing board 4 is inserted into the long hole 2 of the main board 1, the plated wires 11 and 12 on the main board 1 are smoothly guided to be spread outwards along the circular taper faces 5A and 6A on both side faces of the standing board 4 and fitted and engaged in the engagement grooves 8 and 9 of the standing board 4, as shown in FIG. 2B.

In the standing board fixing structure according to the second embodiment, since the circular taper faces 5A and 6A are formed in the bottom portion on both side faces of the standing board 4, when the bottom portion of the standing board 4 is inserted into the long hole 2 of the main board 1, the plated wires 11 and 12 on the main board 1 are smoothly guided along the circular taper faces 5A and 6A, and fitted and engage in the engagement grooves 8 and 9, so that the bottom portion of the standing board 4 is smoothly inserted into the long hole 2 of the main board 1, whereby the standing board 4 is stood and fixed on the main board 1 without cutting the plated wires 11 and 12 by smoothly inserting the standing board 4 into the long hole 2 of the main board 1.

Figure 3A:
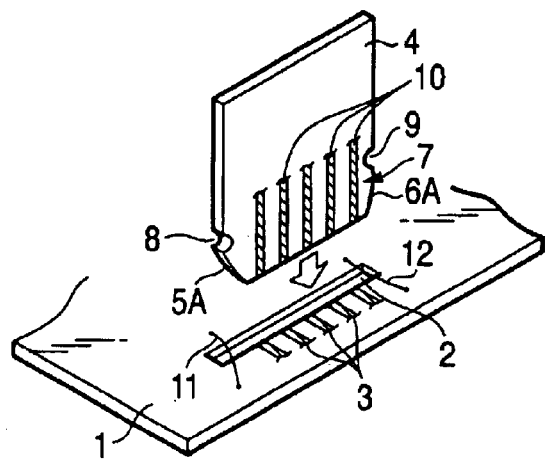
Figure 3B:
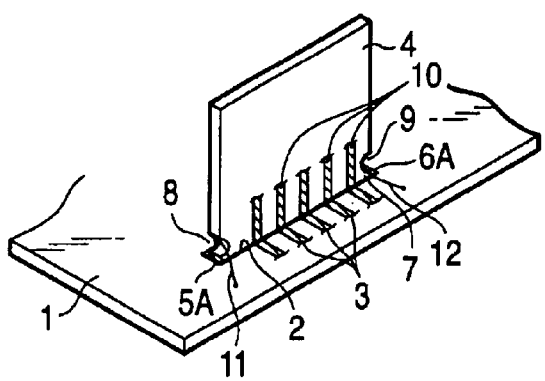
Figure 4A:
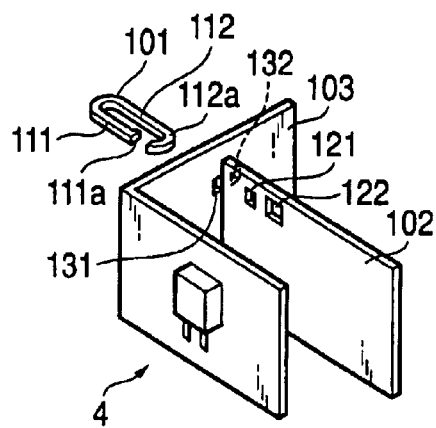
Figure 4B:
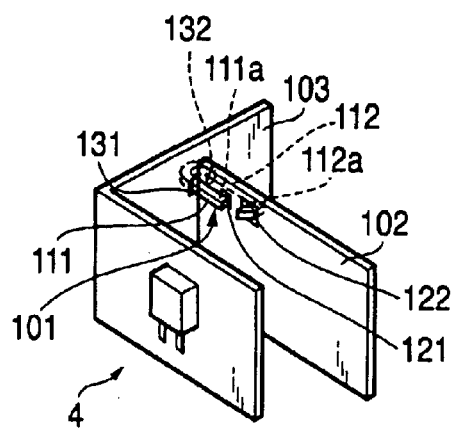
Figure 4C:
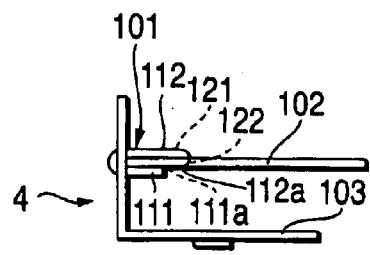
Figure 5A:
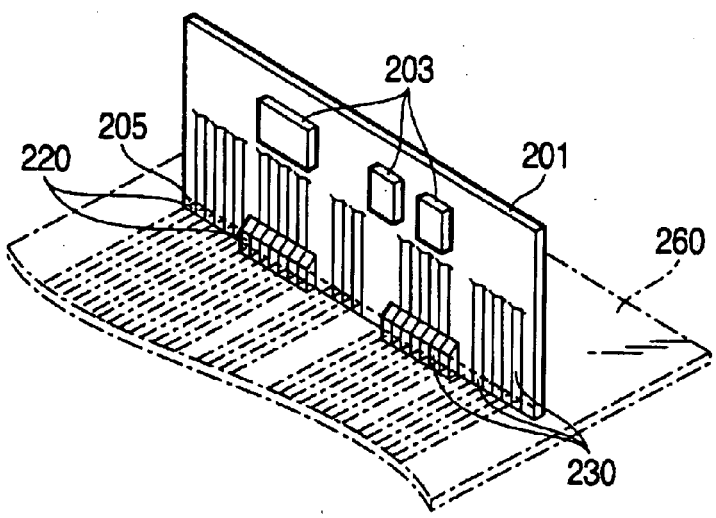
Figure 5B:
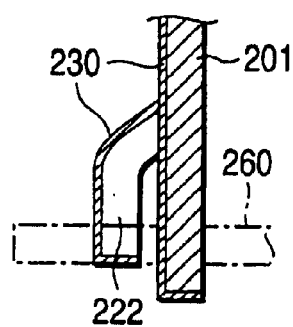
Figure 5C:
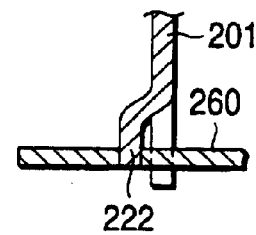
Figure 6A:
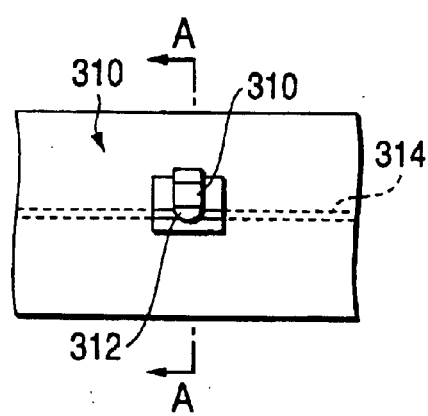
Figure 6B:
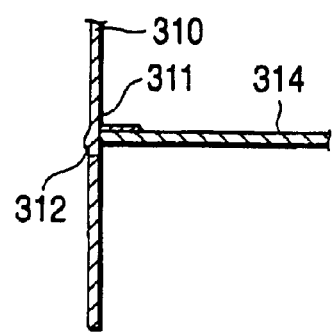

FIGS. 3A and 3B show a standing board fixing structure according to a third embodiment of the invention, in which FIG. 3A is a perspective view showing a state before a standing board is stood and fixed on the main board, and FIG. 3B is a perspective view showing a state in which the standing board is stood and fixed on the main board.

In the standing board fixing structure, the plated wires 11 and 12 are attached onto the main board 1 to be spread to left and right toward a face where the pattern 10 of the standing board 4 is soldered to the pattern 3 of the main board 1, as shown in FIG. 3A.

In the standing board fixing structure according to the third embodiment, the plated wires 11 and 12 attached to be spread to left and right push the standing board 4 forwards in the figure, when the bottom portion of the standing board 4 is inserted into the long hole 2 of the main board 1, so that the pattern 10 of the standing board 4 is securely contacted with the pattern 3 of the main board 1, making it possible to keep the conducting state of the patterns 3 and 10 excellent.

As described above, the first aspect of the present invention provides a standing board fixing structure comprising: a main board having a long hole bored in a predetermined region thereof and a pattern; a standing board to be fixed on the main board in a standing state by inserting a bottom portion thereof into the long hole, the standing board having a pattern corresponding to the pattern of the main board, taper faces of convergent shape in the bottom portion on both side faces thereof and engagement grooves formed at an upper end portion of each taper face; and a plated wire attached onto a surface of the main board to stride across a region in the long hole of the main board corresponding to a lower edge portion on each taper face of the standing board, wherein when the standing board is inserted into the long hole of the main board, the plated wire is guided to be gradually spread outwards along the taper faces of the standing board and fitted and engaged in the engagement grooves, and the corresponding patterns of the standing board and the main board are soldered, whereby the standing board is stood and fixed on the main board. Accordingly, the following effect is provided.

That is, the plated wire is only employed, in addition to the standing board and the main board, whereby the fixing structure has a simple constitution, a smaller number of parts, and a lower cost, and there is no need for modifying the standing board stood on the main board for a float or tumble at the time of DIP, and an inclination of the standing board after being fixed. Since the corresponding patterns of the standing board and the main board are soldered, the standing board is firmly fixed on the main board.

The second aspect of the invention provides a standing board fixing structure comprising: a main board having a long hole bored in a predetermined region thereof; a standing board to be fixed on the main board in a standing state by inserting a bottom portion thereof into the long hole, the standing board having engagement grooves formed on both side faces thereof; and a plated wire attached onto a surface of the main board to stride across a region in the long hole of the main board corresponding to a lower edge portion on each side face of the standing board, wherein when the standing board is inserted into the long hole of the main board, the plated wire is fitted and engaged in the engagement grooves of the standing board, whereby the standing board is stood and fixed on the main board.

That is, the plated wire is only employed, in addition to the standing board and the main board, whereby the fixing structure has a simple constitution, a smaller number of parts, and a lower cost, and there is no need for modifying the standing board stood on the main board for a float or tumble at the time of DIP, and an inclination of the standing board after being fixed.

According to the third aspect of the invention, the corresponding patterns of the standing board stood on the main board and the main board are soldered whereby the standing board is stood and fixed on the main board. Therefore, since the corresponding patterns of the standing board and the main board, the standing board is firmly fixed on the main board.

According to the fourth aspect of the invention, the plated wire is attached onto the main board to be spread to left and right toward a face where a pattern of the standing board is soldered to a pattern of the main board. Accordingly, the plated wire attached to be spread to left and right push the standing board forwards in the figure, when the bottom portion of the standing board is inserted into the long hole of the main board, whereby the pattern of the standing board is surely contacted with the pattern of the main board, making it possible to keep the conducting state of the patterns excellent.

According to the fifth aspect of the invention, a circular taper face of convergent shape converging toward the lower end is formed in a portion to be inserted into the long hole of the main board on both side faces of the standing board, wherein when the standing board is inserted into the long hole of the main board, the plated wire on the main board is guided to be spread outwards along the circular taper faces on both side faces of the standing board and fitted and fitted and engaged in the engagement grooves of the standing board. Accordingly, when the bottom portion of the standing board is inserted into the long hole of the main board, the plated wire on the main board is smoothly guided along the circular taper faces and fitted and engaged in the engagement grooves, whereby the plated wire is not cut, and the bottom portion of the standing board is smoothly inserted into the long hole of the main board, so that the standing board is stood and fixed on the main board.

What is claimed is:

1. A standing board fixing structure comprising:

a main board having a long hole bored in a predetermined region thereof and a pattern;

a standing board to be fixed on the main board in a standing state by inserting a bottom portion thereof into the long hole, the standing board having a pattern corresponding to the pattern of the main board, taper faces of convergent shape in the bottom portion on both side faces thereof and engagement grooves formed at an upper end portion of each taper face; and a plated wire attached onto a surface of the main board to stride across a region in the long hole of the main board corresponding to a lower edge portion on each taper face of the standing board, wherein when the standing board is inserted into the long hole of the main board, the plated wire is guided to be gradually spread outwards along the taper faces of the standing board and fitted and engaged in the engagement grooves, and the corresponding patterns of the standing board and the main board are soldered, whereby the standing board is stood and fixed on the main board.

2. A standing board fixing structure comprising:

a main board having a long hole bored in a predetermined region thereof;

a standing board to be fixed on the main board in a standing state by inserting a bottom portion thereof into the long hole, the standing board having engagement grooves formed on both side faces thereof; and a plated wire attached onto a surface of the main board to stride across a region in the long hole of the main board corresponding to a lower edge portion on each side face of the standing board, wherein when the standing board is inserted into the long hole of the main board, the plated wire is fitted and engaged in the engagement grooves of the standing board, whereby the standing board is stood and fixed on the main board.

3. The standing board fixing structure according to claim 2, wherein the corresponding patterns of the standing board stood on the main board and the main board are soldered whereby the standing board is stood and fixed on the main board.

4. The standing board fixing structure according to claim 3, wherein the plated wires is attached to be spread to left and right toward a face of the main board where a pattern of the standing board is soldered to a pattern of the main board.

5. The standing board fixing structure according to claim 2, wherein a circular taper face of convergent shape converging toward the lower end is formed in a portion to be inserted into the long hole of the main board on both side faces of the standing board, and when the standing board is inserted into the long hole of the main board, the plated wire on the main board is guided to be spread outwards along the circular taper face on both side faces of the standing board and fitted and engaged in the engagement grooves of the standing board.

* * * * *